United States Patent [19]

Blanchard et al.

[11] Patent Number: 4,816,882

[45] Date of Patent: Mar. 28, 1989

[54] POWER MOS TRANSISTOR WITH EQUIPOTENTIAL RING

[75] Inventors: Richard A. Blanchard, Los Altos; Adrian Cogan, San Jose, both of Calif.

[73] Assignee: Siliconix Incorporated, Santa Clara, Calif.

[21] Appl. No.: 138,989

[22] Filed: Dec. 29, 1987

Related U.S. Application Data

[63] Continuation-in-part of Ser. No. 838,217, Mar. 10, 1986.

[51] Int. Cl.[4] .............................................. H01L 29/78
[52] U.S. Cl. ................................. 357/23.4; 357/23.8; 357/53; 357/86; 357/52
[58] Field of Search ...................... 357/23.4, 23.8, 53, 357/86, 47, 52

[56] References Cited

U.S. PATENT DOCUMENTS

| | | | |
|---|---|---|---|
| 3,909,119 | 9/1975 | Wolley | 357/13 |
| 4,145,700 | 3/1979 | Jambotkar | 357/23.4 |
| 4,158,206 | 6/1979 | Neilson | 357/13 |
| 4,300,150 | 11/1981 | Colak | 357/23 |
| 4,345,265 | 8/1982 | Blanchard | 357/23 |
| 4,374,389 | 2/1983 | Temple | 357/13 |
| 4,414,560 | 11/1983 | Lidon | 357/39 |
| 4,443,931 | 4/1984 | Baliga et al. | 29/571 |
| 4,468,686 | 8/1984 | Rosenthal | 357/53 |
| 4,567,502 | 1/1986 | Nakagawa | 357/53 |
| 4,609,929 | 9/1986 | Jayaraman et al. | 357/234 |
| 4,631,564 | 12/1986 | Neilson et al. | 357/234 |

OTHER PUBLICATIONS

Bagliga et al., "The Insulated Gate Transistor: a New Three-Terminal, MOS-Controlled Bipolar Power Device", IEE Transactions on Electron Devices, vol. ED-31, No. 6, Jun. 1987, pp. 821-828.

Conti et al., "Surface Breakdown in Silicon Planar Diodes Equipped with Field Plate", Solid State Electronics, 1972, vol. 15, pp. 93-105.

Primary Examiner—Eugene R. LaRoche
Assistant Examiner—David L. Soltz
Attorney, Agent, or Firm—Skjerven, Morrill, MacPherson, Franklin & Friel

[57] ABSTRACT

A process for manufacturing a DMOS transistor in accordance with the present invention includes the steps of forming a layer of gate insulation (12, 14) on an N type substrate (10). A layer of polycrystalline silicon (16) is formed on the gate insulation layer. A first mask (18) is used to define the polycrystalline silicon gate. A layer of silicon dioxide (20) is then formed on the polycrystalline silicon gate. A second photolithographic mask (22) is formed on the wafer. The deep body region is then formed. Thereafer, portions of the gate insulation layer not covered by the polycrystalline silicon gate are removed. The P type body region (26) and N+ source region (28) are then formed having a lateral extent defined by the edge of the polycrystalline silicon gate. A conductive layer 30 is formed on the wafer and photolithographically patterned. A passivation layer 34 is then formed on the wafer. Several types of termination are available, involving various combinations of device perimeter regions, field plates, metallized equipotential rings, and field limiting rings. Of importance, the above-described process uses only 4 photolithographic masking steps.

15 Claims, 8 Drawing Sheets

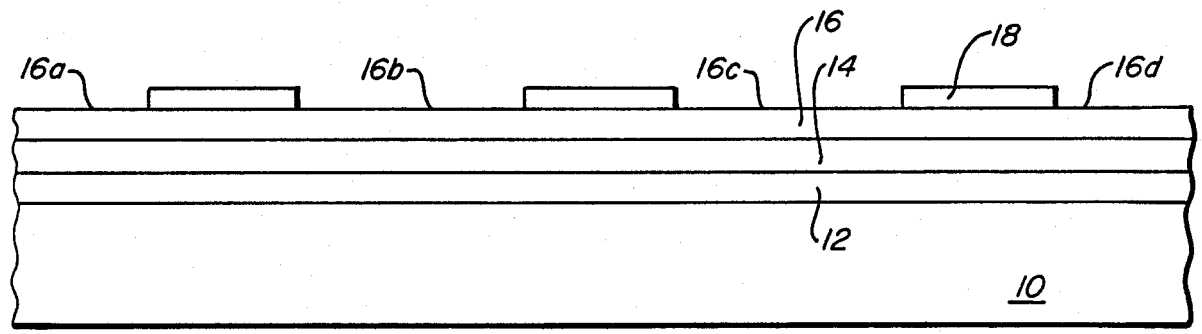
FIG._1
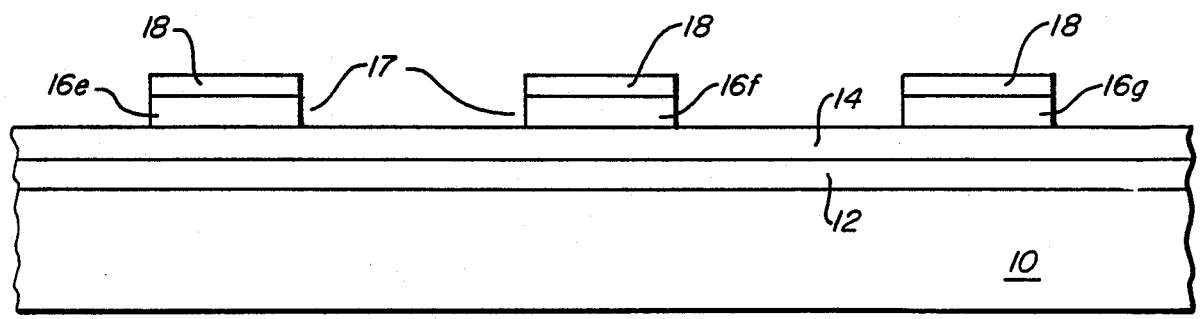
FIG._2
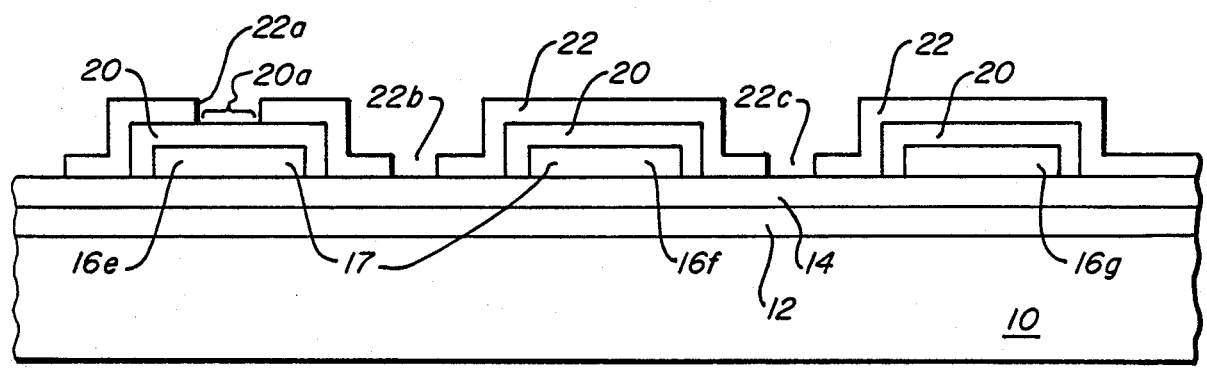
FIG._3
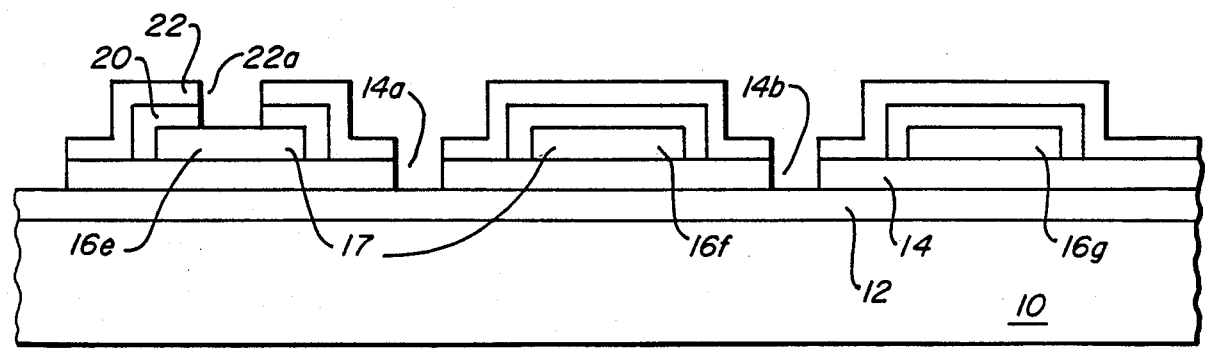
FIG._4

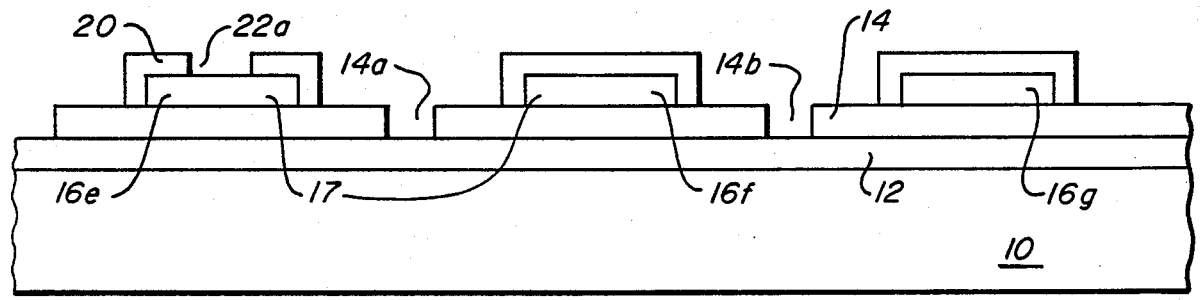
FIG._5
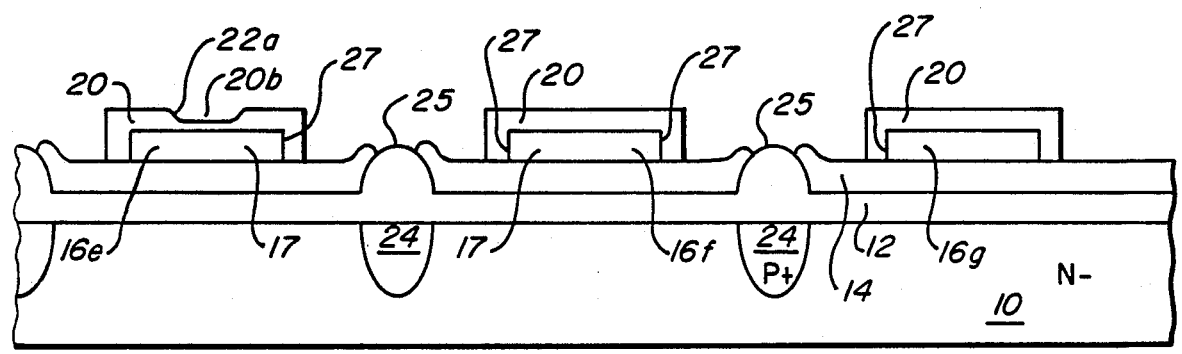
FIG._6
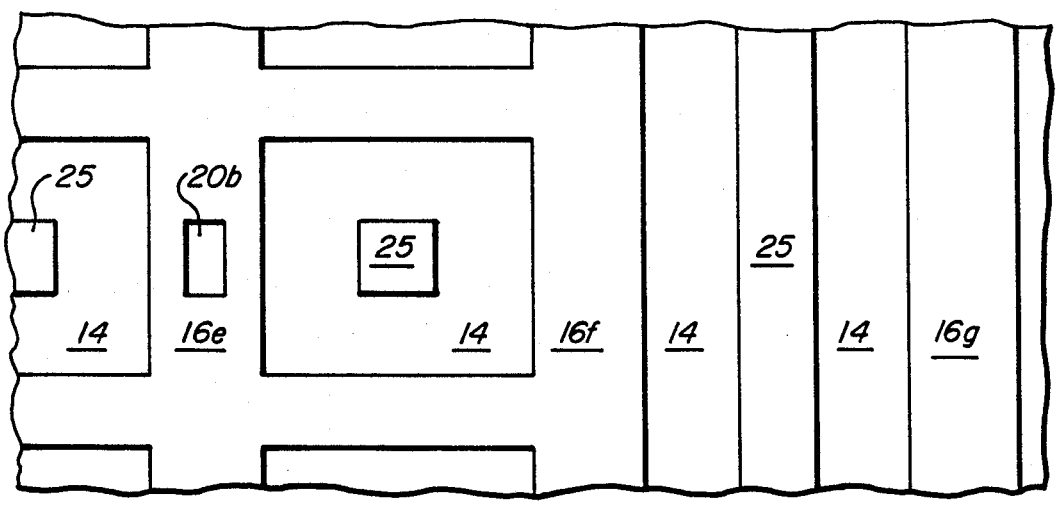
FIG._6a

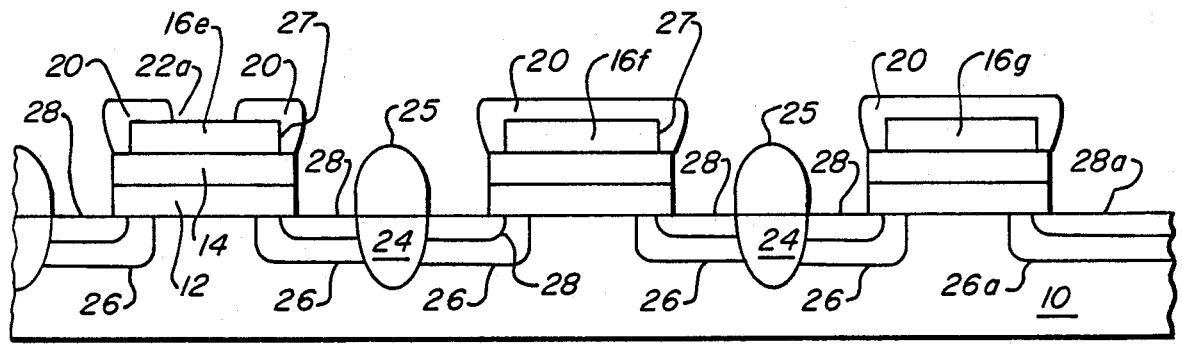
FIG._7
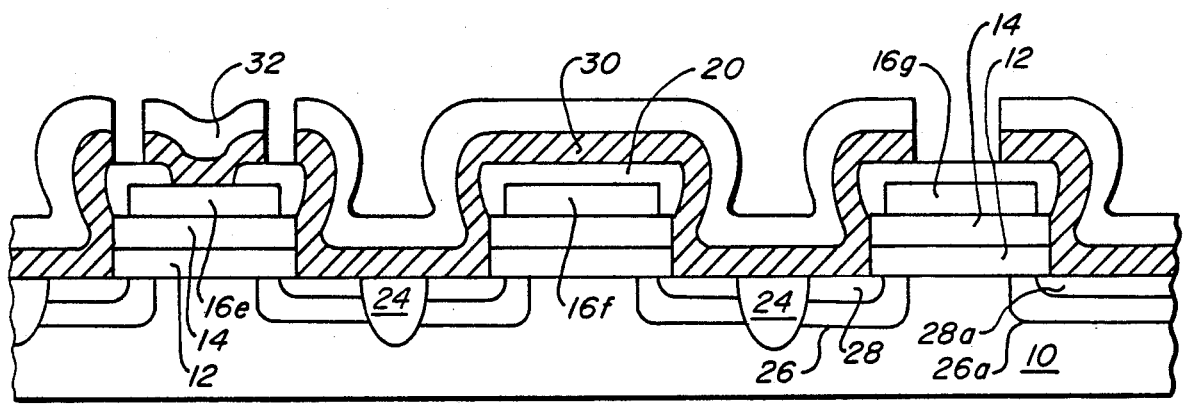
FIG._8
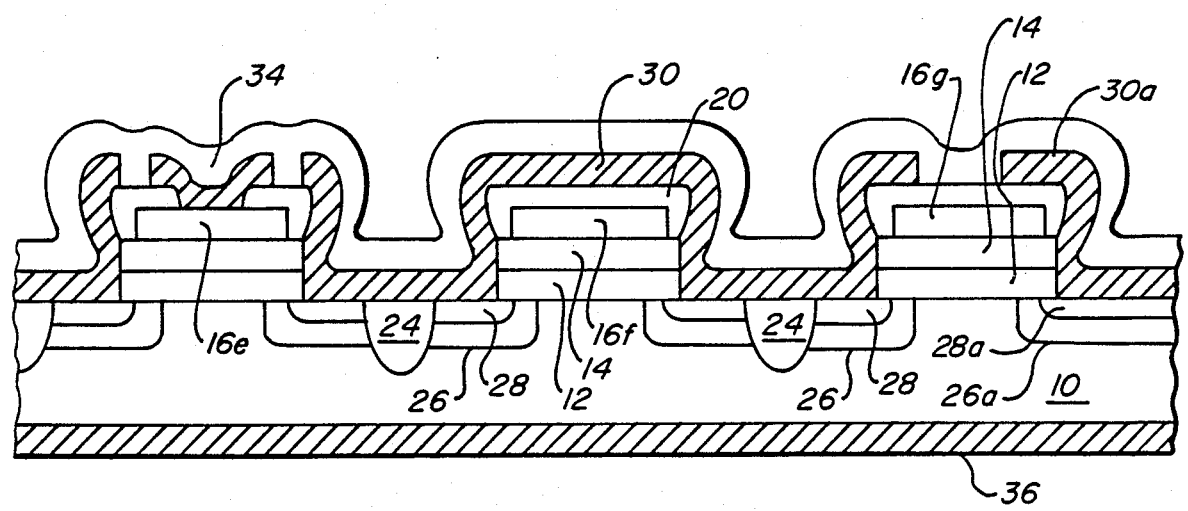
FIG._9

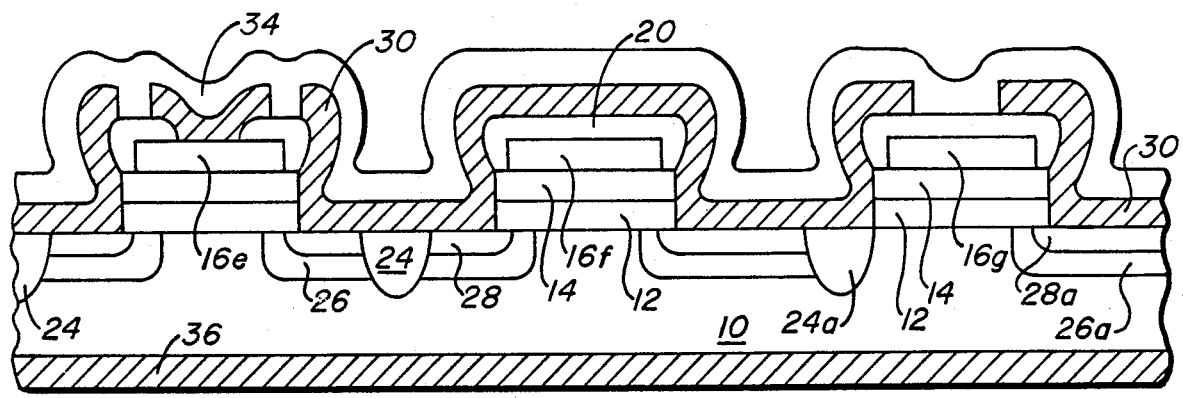
FIG._10.
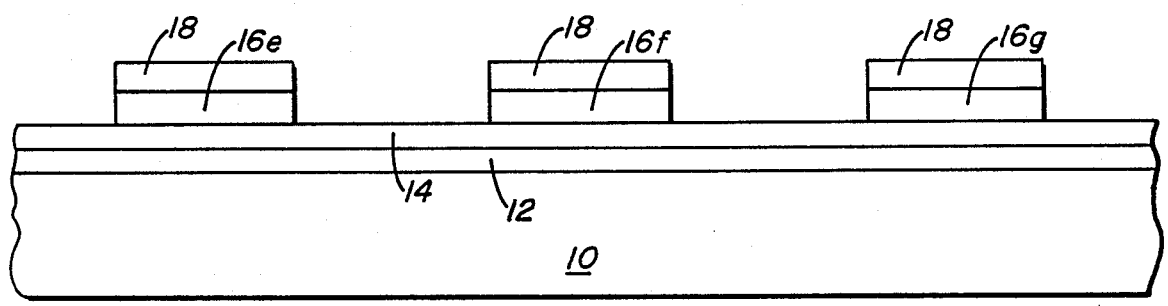
FIG._10A.
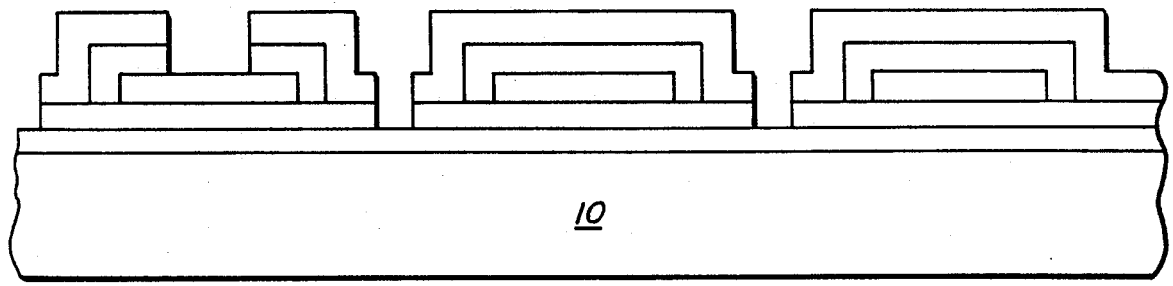
FIG._10B.

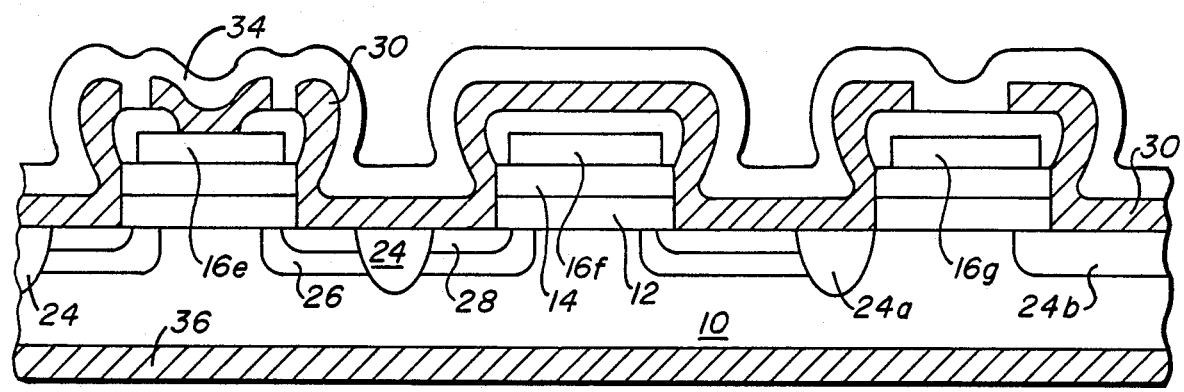
FIG._11.
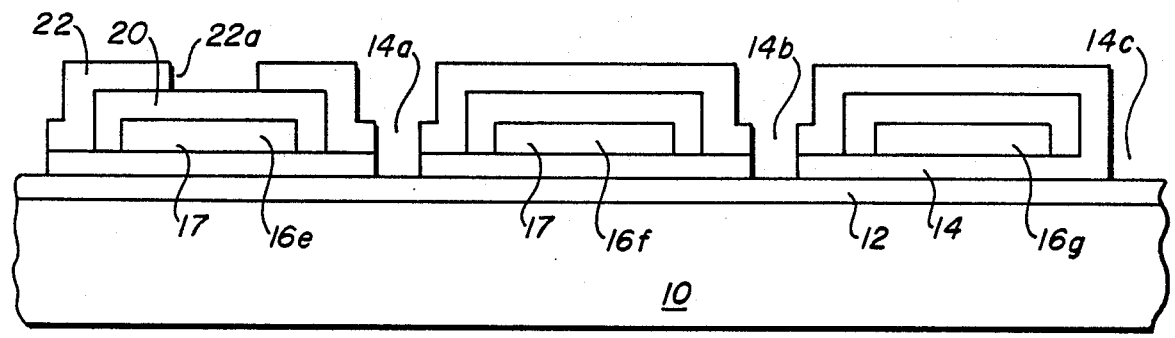
FIG._11A.

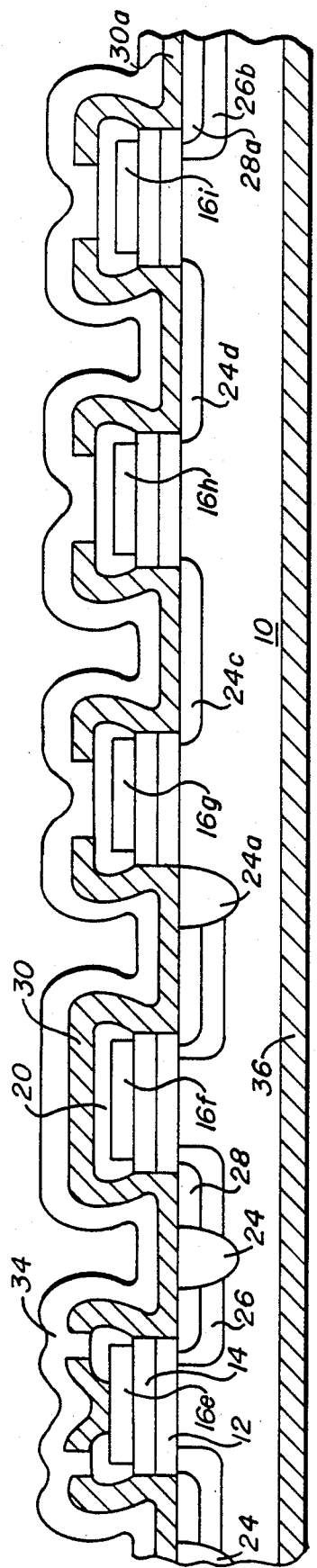
FIG._12.
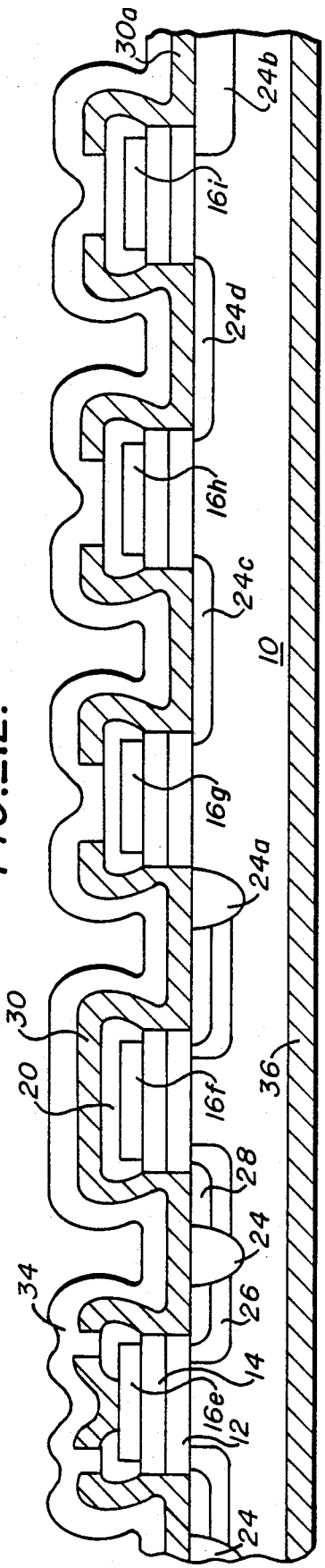
FIG._13.
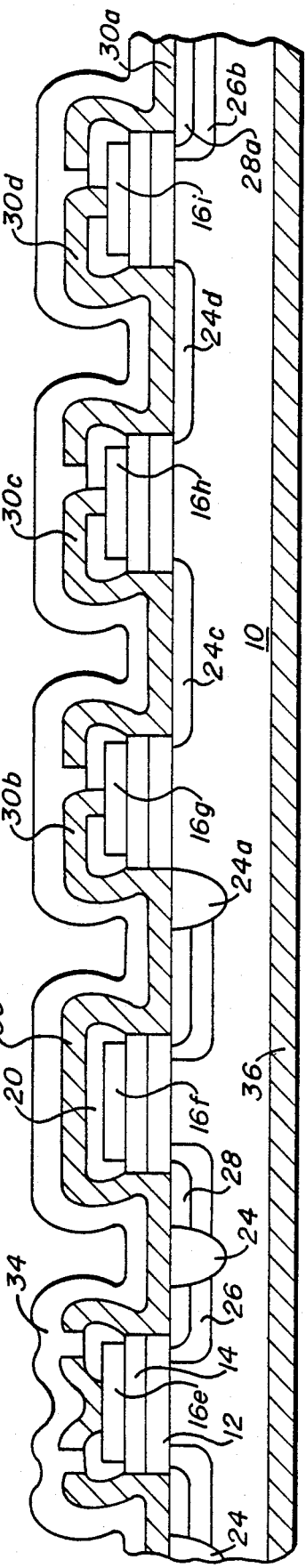
FIG._14.

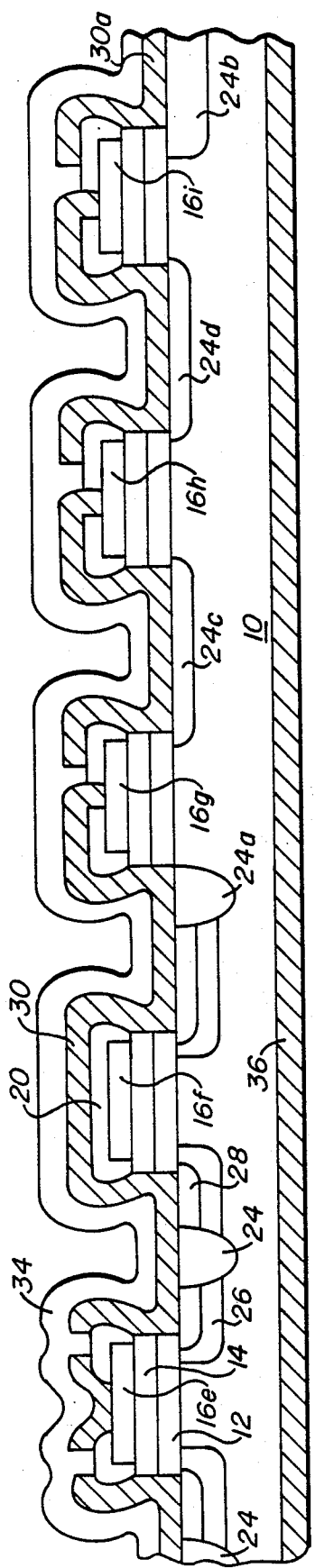
FIG._15.
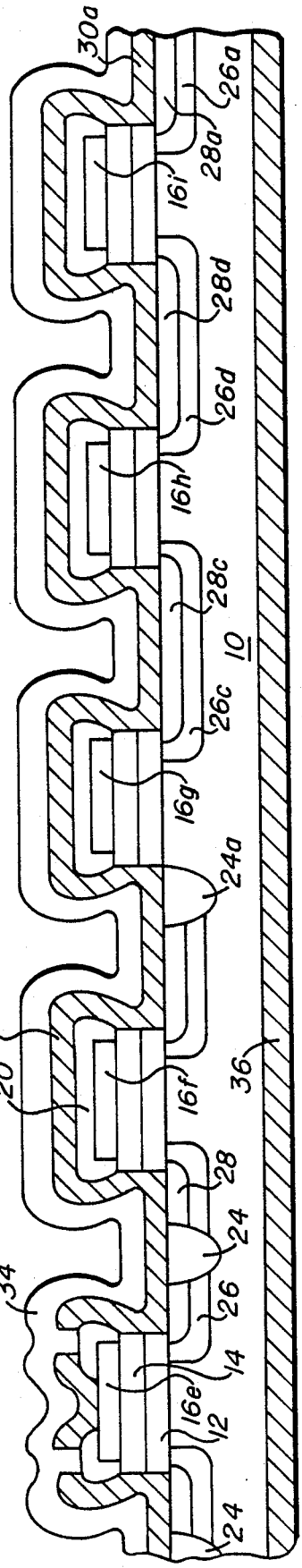
FIG._16.
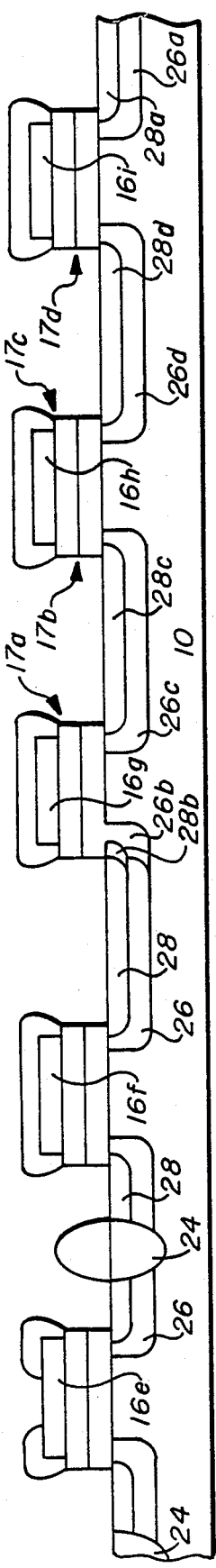
FIG._16a.

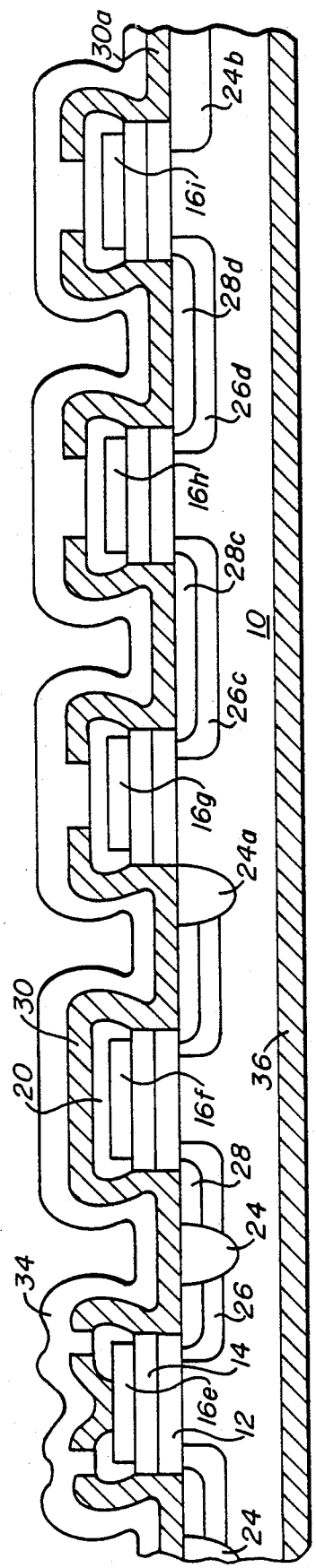
FIG._17.
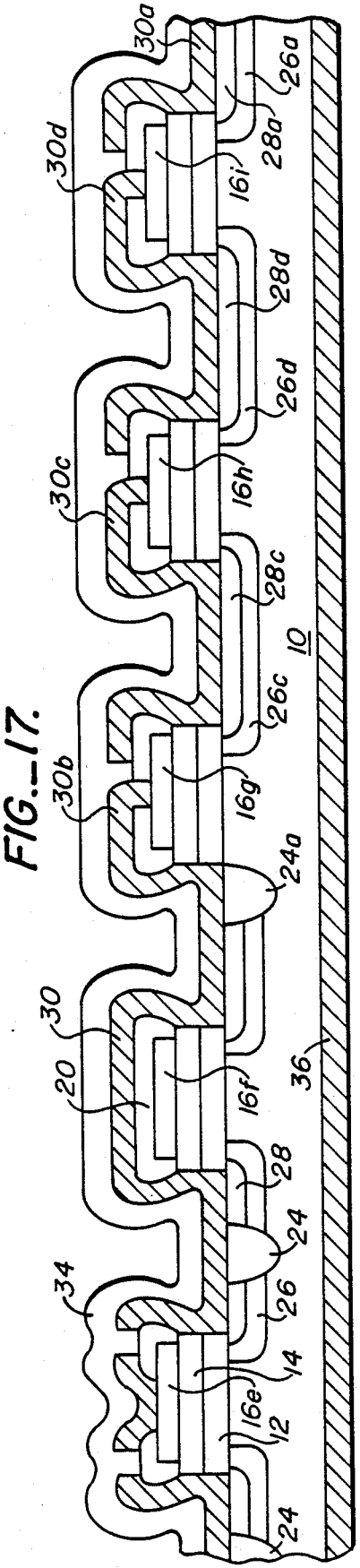
FIG._18.
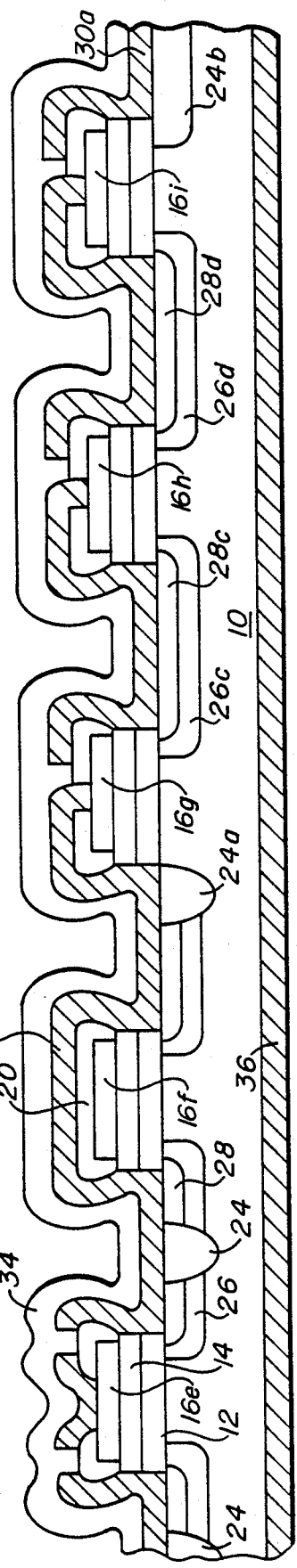
FIG._19.

POWER MOS TRANSISTOR WITH EQUIPOTENTIAL RING

This is a continuation-in-part application of copending U.S. Application Ser. No. 06/838,217 filed Mar. 10, 1986.

BACKGROUND

This invention relates to MOS transistors and more specifically to methods for manufacturing MOS transistors with a minimum number of masking steps. The invention also relates to double diffused MOS ("DMOS") transistors.

A DMOS transistor is a MOS transistor having a channel length defined by the difference in diffusion of sequentially introduced impurities from a common edge or boundary. One example of a prior art process for manufacturing a DMOS transistor is discussed in U.S. Pat. No. 4,443,931, issued to Baliga, et al., incorporated herein by reference. It is known in the art that it is desirable to manufacture DMOS transistors while minimizing the number of masks used. One reason for this is that by minimizing the numbers of masks, the number of alignment steps is also minimized and therefore the need to accommodate alignment tolerances is minimized. As is known in the art, if the need to accommodate alignment tolerances is minimized, the size and cost of the resulting transistor is minimized.

Another reason for minimizing the number of masking steps is that the complexity of the manufacturing process is correspondingly reduced and thus the cost of producing the transistor is also reduced.

SUMMARY

A method for manufacturing a DMOS transistor in accordance with the present invention includes the step of providing a gate insulation layer on a semiconductor substrate. The semiconductor substrate is typically N type silicon and the gate insulation layer typically comprises a silicon nitride layer formed on a silicon dioxide layer. A gate is then formed on the gate insulation layer. In one embodiment of the invention, the gate is polycrystalline silicon and is formed by depositing a polycrystalline silicon layer on the gate insulation layer and using a first photolithographic mask to protect portions of the polycrystalline silicon layer while the exposed portions of the polycrystalline silicon layer are removed.

The resulting gate is covered with a second insulation layer which in on embodiment comprises silicon dioxide. A second photolithographic mask is formed on the wafer. In accordance with one novel feature of this invention, the second mask includes both a first window region defining the deep body region of the DMOS transistor and a second window region defining the gate contact. The portion of the second insulation layer within the second window region is removed. Of importance, the portion of the silicon nitride layer within the first window region is also removed and the underlying portion of the semiconductor substrate is implanted with a P type dopant, thereby forming the deep body region.

A silicon dioxide layer is then formed within the second window region, typically by thermal oxidation. Of importance, the thickness of the silicon dioxide within the first region also increases during this process. The exposed portion of the silicon nitride layer and the underlying silicon dioxide layer are then removed using a blanket etching process which does not require additional masking. At the conclusion of the blanket etching process, however, the silicon dioxide formed on the gate and the silicon dioxide formed above the deep body region remain. The silicon dioxide above the deep body region serves as an oxide mask which defines part of a subsequently formed source region.

P type dopants are then implanted into the semiconductor substrate to form the body region of the DMOS transistor. Thereafter, N type dopants are implanted into the semiconductor substrate to form the source region. As mentioned above, the oxide mask grown over the deep body region prevents the underlying deep body region from being predoped or implanted with N type impurities. Of importance, the lateral extent of the source and body regions is defined by the edge of the gate and the oxide mask. Therefore, it is not necessary to use an extra masking step to define the source and body regions of the DMOS transistor.

The oxide mask above the deep body region, the silicon dioxide within the second window, and any silicon dioxide formed above the source region during source and body drive-in are removed with a blanket etching process. A conductive layer (typically metal) is then formed on the surface of the wafer. A third photolithographic mask is applied to the wafer in order to pattern the conductive layer to form a gate lead and a source/body lead.

The wafer is then coated with a passivation layer of material such as silicon nitride or silicon dioxide at a low temperature (typically less than 450° C.). A fourth photolithographic mask is used to define regions where the passivation layer is to be removed, e.g. bonding pad regions. Of importance, the above described process requires only four photolithographic masks. Accordingly, the process is simpler than prior art DMOS manufacturing processes. Further, the need to increase the transistor size in order to allow for misalignment of the various photolithographic masks is reduced.

In one embodiment, the transistor is laterally surrounded by an equipotential ring (EQR). (An EQR is a region of material surrounding a semiconductor device such that all points within the region are at the same electrical potential.) In accordance with one novel feature of the invention, the EQR includes a P region (formed concurrently with the body region), an N+ region within the P region (formed concurrently with the source region) and a conductive ring formed on the N+ region (formed concurrently with the gate lead and the source/body lead). The conductive ring is electrically coupled to the substrate, the P region, and the N+ region, and is biased at the same voltage as the transistor drain. Alternatively, the N+ region can be omitted. As explained in greater detail below, the EQR enhances the reliability of the DMOS transistor. Of importance, the EQR is formed without any extra masking steps:

In another embodiment, the transistor is laterally surrounded by an EQR comprising a P+ region (formed concurrently with the deep body region) and a conductive layer (formed concurrently with the gate lead and the source/body lead) formed on the P+ region. The conductive layer and P+ region are electrically shorted to the substrate.

These and other features of the present invention are described in greater detail below.

BRIEF DESCRIPTION OF THE DRAWINGS

FIGS. 1 to 9 illustrate a portion of a DMOS transistor during various steps of a manufacturing process in accordance with the present invention.

FIGS. 10 to 19 illustrate the types of termination available.

DETAILED DESCRIPTION

A process in accordance with the present invention begins with the step of forming a silicon dioxide layer 12 on a semiconductor wafer 10 (FIG. 1). In one embodiment of the invention, wafer 10 consists of a layer of N type epitaxial silicon having a conductivity of about 1.5 ohm-centimeters, and a thickness of about 12 $\mu$m, formed on a heavily doped substrate. However, other semiconductor materials and materials having other conductivities and conductivity types are also appropriate. (As used herein, the term "wafer" includes the substrate and all layers formed directly or indirectly on the substrate.)

Silicon dioxide layer 12 is typically thermally grown to a thickness of about 50 nanometers (nm). A silicon nitride layer 14 is then formed on silicon dioxide layer 12. Silicon nitride layer 14 is also typically about 50 nm thick and typically is formed by chemical vapor deposition. As will be discussed in greater detail below, silicon dioxide layer 12 and silicon nitride layer 14 serve as gate insulation for a subsequently formed DMOS transistor.

A polycrystalline silicon layer 16 is then formed on silicon nitride layer 14. In one embodiment, polycrystalline silicon layer 16 is formed to a thickness of about 500 nm by chemical vapor deposition. As described in greater detail below, polycrystalline silicon layer 16 serves as the gate of the DMOS transistor. Polycrystalline silicon layer 16 is then doped to a sheet resistance of about 15 ohms per square with an N type dopant such as phosphorus.

Polycrystalline silicon layer 16 is then covered with a photoresist layer 18 which is then patterned in a conventional manner, thereby exposing portions 16a to 16d of polycrystalline silicon layer 16. Exposed portions 16a to 16d of polycrystalline silicon layer 16 are then removed, thereby leaving polycrystalline silicon gates 16e and 16f and a field plate 16g as illustrated in FIG. 2. (In other embodiments, gates 16e and 16f and field plate 16g are of a material other than polycrystalline silicon, e.g. a metal such as refractory metal or silicide.) Although polycrystalline silicon gates 16e and 16f appear as separate structures, in one embodiment they are a single contiguous polycrystalline silicon gate 17 joined outside the cross section of FIG. 2. (In another embodiment, gates 16e and 16f are not a single contiguous region. However, in such an embodiment, gates 16e and 16f can be electrically connected together with a subsequently formed conductive layer.) As described below, field plate 16g surrounds the transistor and defines a subsequently formed EQR which surrounds field plate 16g. In this way, photoresist layer 18 serves as a first mask for defining the gate of the DMOS transistor, a field limiting ring, and an EQR surrounding the transistor.

Referring to FIG. 3, the remaining portions of photoresist layer 18 are removed and polycrystalline silicon gate 17 and ring 16g are covered with a silicon dioxide layer 20. In one embodiment, silicon dioxide layer 20 is thermally grown to a thickness of about 500 nm.

The wafer is then covered with a photoresist layer 22 which is then patterned in a known manner, thereby forming window regions 22a, 22b, and 22c in photoresist layer 22. As will hereinafter become apparent, window region 22a defines an electrical contact to polycrystalline silicon gate 17 while window regions 22b and 22c define a P+ deep body region of the DMOS transistor.

Referring to FIG. 4, portion 20a of silicon dioxide layer 20 within window region 22a is removed and the portions of silicon nitride layer 14 within window regions 22b and 22c are removed. In one embodiment, portion 20a is removed by placing the wafer in a buffered HF solution. Of importance, photoresist layer 22 protects the underlying portions of silicon dioxide layer 20. However, the portion of silicon dioxide layer 20 within window region 22a is unprotected and therefore is removed by the HF solution. In addition, an oxidized nitride skin, typically formed to a thickness of 5 to 10 nm during the preceding process steps within window regions 22b and 22c, is also removed by the HF solution. Thereafter, wafer 10 is removed from the buffered HF solution and placed, for example, in a phosphoric acid solution which removes the portions of silicon nitride layer 14 within window regions 22b and 22c, thereby forming window regions 14a and 14b. Wafer 10 is then removed from the phosphoric acid solution and photoresist layer 22 is removed. The resulting structure is illustrated in FIG. 5.

In other embodiments of the invention, instead of using an HF solution and phosphoric acid to etch silicon dioxide layer 20 and silicon nitride layer 14, respectively, plasma etching, reactive ion etching, or ion milling are used.

Referring to FIG. 6, P+ deep body regions 24 are formed in the semiconductor material within the wafer 10, e.g., by implanting P type ions in the portion of wafer 10 within window regions 14a and 14b. In one embodiment, boron ions are implanted with a dosage of about $2 \times 10^{14}$/cm$^2$ and an implant energy of about 40 Kev. The dosage may be as much as $10^{16}$/cm$^2$ (Of importance, the implant energy and dose are selected to guarantee that ions are not implanted into the portions of the wafer covered by both silicon dioxide layer 12 and silicon nitride layer 14.) Although during this process some ions are also implanted into polycrystalline silicon gate 17 where silicon dioxide layer 20 has been removed, because of the high N type dopant concentration in polycrystalline silicon gate 17, the gate conductivity is not significantly changed during this process. It is also noted that the portions of silicon dioxide layer 12 within window regions 14a and 14b prevent unwanted introduction of impurities into the semiconductor material within window regions 14a and 14b and prevent unwanted loss of boron during subsequent high temperature processing steps.

The wafer is then subjected to a drive-in process. During this drive-in process, a thin silicon dioxide layer 20b (typically about 50 nm thick) is formed on polycrystalline silicon 16e. In addition, portions 25 of silicon dioxide layer 12 above P+ deep body region 24 also increase in thickness. Of importance, during the diffusion of P+ regions 24, silicon dioxide layers 20b and 25 prevent impurities from diffusing out of gate 17 and into the substrate or epitaxial layer within wafer 10.

FIG. 6a illustrates in plan view a portion of the transistor at this point in the manufacturing process. Region 24 and layer 20 are not shown in FIG. 6a to simplify the illustration.

The portions of silicon nitride layer 14 not covered by gate 17 or polycrystalline silicon ring 16g are then removed. In one embodiment this is done by placing the wafer in a phosphoric acid solution. However, the exposed portions of silicon nitride layer 14 can be removed in other ways as well, e.g., reactive ion etching or plasma etching. Silicon dioxide layer 20b and the exposed portions of silicon dioxide layer 12 are then removed by placing the wafer in a buffered HF solution. In other embodiments, layer 20b and the exposed portions of silicon dioxide layer 12 are removed with plasma etching or reactive ion etching. Of importance because of the thickness of silicon dioxide layers 20 (500 nm) and 25 (220 to 230 nm), silicon dioxide layers 20 and 25 remain largely intact during this etching process. In addition, the portions of silicon nitride layer 14 and silicon dioxide layer 12 underneath gate 17 and polycrystalline silicon ring 16g also remain. Of importance, up to this point in the process, only two photolithographic masks have been applied to the wafer.

Referring to FIG. 7, P type body region 26 is formed, e.g. by ion implantation. In one embodiment, boron ions are implanted into wafer 10 with a dosage of about $5 \times 10^{13}/cm^2$ and an implant energy of approximately 50 Kev. Of importance, the lateral extent of P type body region 26 is defined by edges 27 of gate 17. Therefore, no additional photolithographic masks or alignment steps are required during formation of body region 26. The wafer is then subjected to a drive-in process.

A P type region 26a is formed concurrently with body region 26. However, as described below, P region 26a does not serve as a body region, but rather as part of an EQR.

Thereafter, N+ source regions 28 are formed, e.g. by ion implantation. In one embodiment, arsenic ions are implanted into wafer 10 with a dosage of about $5 \times 10^{15}/cm^2$ and an implant energy of about 40 Kev. Phosphorus ions may be used instead of arsenic. The lateral extent of N+ source region 28 is also defined by edges 27 of gate 17 and the edge of silicon dioxide 25. The wafer is then subjected to another drive-in process. Thereafter, silicon dioxide 25 and any silicon dioxide formed above source regions 28 or within window 22a during the same drive-in process is removed in a blanket etching process, e.g. by placing the wafer in a buffered HF solution.

An N+ region 28a is formed concurrently with N+ source region 28. However, as described below, N+ region 28a does not serve as a source region but rather as part of the EQR.

Referring to FIG. 8, the wafer is covered with a conductive layer 30. Conductive layer 30 is typically a metal layer such as aluminum or an alloy of aluminum. In other embodiments, conductive layer 30 is another metal. Conductive layer 30 serves as a source/body lead for the transistor as well as a gate lead. The wafer is then covered with a photoresist layer 32 which is patterned in a conventional manner, thereby exposing portions of conductive layer 30. The exposed portions of conductive layer 30 are then removed as illustrated in FIG. 8.

Photoresist layer 32 is then removed and the wafer is covered with a passivating layer of insulation such as plasma deposited silicon nitride layer 34. In other embodiments, layer 34 is silicon dioxide. Portions of conductive layer 30 extend to an area on the wafer where bonding pads are formed (not shown). Passivating layer 34 is patterned by applying a fourth photolithographic mask to the wafer. The fourth photolithographic mask includes window regions exposing the portions of the passivating layer 34 above the bonding pads. The exposed portions of passivating layer 34 are then removed, thereby exposing the portions of conductive layer 30 at the bonding pad.

After passivation layer 34 is patterned, a conductive layer 36 (also typically a metal such as aluminum is formed on the bottom of the wafer (FIG. 9). Conductive layer 36 serves as a drain contact, and is typically not patterned.

A portion 30a of conductive layer 30 (the EQR) is then shorted to substrate 10 and P region 26a. In one embodiment, this is accomplished by applying a high voltage to portion 30s of conductive layer 30 relative to substrate 10. Portion 30a is typically shorted to substrate 10 and P region 26a during wafer sort. (Wafer sort is the electrical testing of devices formed in the wafer before the wafer is cut into separate devices.) In another embodiment, the leakage of the scribe "cut" or "saw" provides sufficient current flow. As mentioned above, the EQR is formed at the periphery of the transistor. As is known in the art, EQRs enhance reliability of a transistor. EQRs are described in "Surface Breakdown In Silicon Planar Diodes Equipped With Field Plate" by Conti et al., published in Solid State Electronics in 1972, Vol. 15, and incorporated herein by reference.

As mentioned above, polycrystalline ring 16g serves as a field plate. Field plate 16g is typically electrically insulated from the other structures formed on the wafer. In an alternative embodiment, a plurality of polycrystalline silicon field plates surround the transistor to further enhance transistor reliability. The field plates are formed by the same process as is polycrystalline field plate 16.

It will be appreciated that a process for manufacturing a DMOS transistor requiring only four photolithographic masks has been described in detail. The process is simple and minimizes the requirement of alignment tolerances. Accordingly, a transistor manufactured with the present process can be manufactured on a smaller surface area than prior art transistors. For example, in a typical prior art transistor, the gate to gate distance (e.g. from polycrystalline silicon 16e to 16f) is about 25 to 30 μm. By using the process of the present invention, this distance can be reduced to about 22 to 28 μm. This represents a savings of about 20% of the surface area of a transistor using a plurality of square cells.

In an alternative embodiment, the above-described process is used to form an insulated gate bipolar transistor. In such an embodiment, source 28, body 26 and deep body region 24 are formed in an N type epitaxial layer which in turn is formed on a P+ substrate. The operation of insulated gate transistor is described in detail in "The Insulated Gate Transistor: A New Three-Terminal MOS-Controlled Bipolar Device," by Baliga et al., published in IEEE Transactions on Electron Devices, Vol. ED-31., No. 6, in June 1984, and incorporated herein by reference.

FIG. 10 illustrates a transistor constructed in accordance with another embodiment of our invention. As can be seen, the difference between the transistor of FIG. 10 and the transistor of FIG. 9 is that the transistor is laterally surrounded by a P+ deep body region 24a. P+ deep body region 24a is formed concurrently with and electrically connected to P+ regions 24. P+ body region 24a serves as a device perimeter region, and is in physical contact with source region 28 and body region 26. P+ region 24a is laterally surrounded by field plate 16g, metallization 30a, N+ region 28a and P region 26a as described above. The advantage of this device termination over that shown in FIG. 9 is that: first, the termiantion with P+ region 24a may have a higher breakdown voltage. But, second, and more important, the use of the P+ region 24a at the perimeter may give a device with greater ruggedness, since any injected charge is shorted directly to the source, and is not able to turn on the parasitic NPN transistor.

The device of FIG. 10 is formed using the same process sequence as discussed above except that mask 18 is patterned so that field plate 16g is closer to gate structure 16f, e.g. as illustrated in attached FIG. 10a. (FIG. 10a illustrates the device of FIG. 10 at the same process step as FIG. 2.) In addition, mask 22 is patterned so that window region 14b is formed adjacent field limiting ring 16g (see FIG. 10b, which illustrates the device of FIG. 10 at the same process step as FIG. 4). In all other regards, device processing is as described above with relation to FIGS. 1–9.

FIG. 11 illustrates another embodiment of the invention, similar to the embodiment of FIG. 10 except that instead of surrounding the transistor with an EQR including N+ region 28a and P region 26a and metallization 30a the transistor is surrounded by an EQR including P+ region 24b (formed concurrently with regions 24a and 24) and metallization layer 30a. Region 24b is not electrically connected to regions 24 or 24a. The transistor of FIG. 11 is formed using the same process sequences discussed above except that mask 22 is patterned to define a window region at the periphery of the wafer 14c, e.g. as illustrated in FIG. 11a. (FIG. 11a illustrates a transistor at the process step illustrated by FIG. 4.) Thus, P+ region 24b is formed at the perimeter of the transistor. P+ region 24b is electrically contacted by EQR metallization layer 30a which in turn is electrically shorted to N type semiconductor material within wafer 10 by applying a high voltage to metal 30a. In another embodiment, the leakage current of the scribe "cut" or "saw" provides sufficient current flow.

FIG. 12 illustrates another embodiment of the invention. The transistor of FIG. 12 is the same as that of FIG. 10, with the addition of two field limiting rings 24c and 24d, and additional floating field plates 16h and 16i, all laterally surounding the transistor. Field limiting rings 24c and 24d are P+ regions formed in the wafer 10 concurrently with P+ regions 24 and 24a. Floating field plates 16h and 16i are insulated polycrystalline (or other conductor) structures formed at the same time as gates 16e and 16f and field plate 16g.

The transistor of FIG. 12 is formed using the same process sequence as described above, except that (1) mask 18 is patterned to create additional insulated polycrystalline floating field plates 16h and 16i; and (2) mask 22 is patterned to create two additional P+ regions 24c and 24d, separated by floating field plate 16h. Also, the die area of the transistor may need to be increased to accommodate the additional structures.

FIG. 13 shows a variant of the transistor depicted in FIG. 12. The variation is that the transistor is surrounded by an EQR structure including a P+ region 24b and EQR metallization 30a. This is the same EQR structure as described above for the transistor shown in FIG. 11.

Another embodiment, very similar to that of FIG. 12, is shown in FIG. 14. The difference between the transistor of FIG. 14 and the transistor of FIG. 12 is that the transistor of FIG. 14 provides electrical connections, by means of metallization 30b, 30c and 30d, respectively, from region 24a to field plate 16g, from field limiting ring 24c to field plate 16h, and from field limiting ring 24d to field plate 16i. Thus, field plates 16g, 16h, and 16i are not electrically insulated in this embodiment. The electrical contact to field plates 16g, 16h, and 16i is accomplished by patterning mask 22 to leave a window in insulating layer 20 on top of polycrystalline silicon layer 16g, 16h and 16i. Then, by means of metallization mask 32, metal layer 30 is patterned so as to form the desired connections 30b, 30c, and 30d between the regions 24a, 24c, and 24d and the adjacent field plates 16g, 16h and 16i.

The transistor of FIG. 14 is otherwise formed using the same process sequence as discussed above.

FIG. 15 depicts a variation on the transistor shown in FIG. 14. In FIG. 15, the transistor is surrounded only by P+ region 24b and EQR metallization 30a, the same EQR structure as the transistor shown in FIG. 10. Again, P+ region 24b is formed at the same time as are regions 24, 24a, 24c, and 24d.

Another embodiment as shown in FIG. 16 is similar to that shown in FIG. 12, including the floating field plates and field limiting rings, except that the field limiting rings are comprised of P regions 26b and 26c in which are formed respectively N+ regions 28b and 28c. The device shown in FIG. 16 is formed by the same process sequence as the device shown in FIG. 12, except that there are no P+ field limiting rings 24c and 24d and instead P field limiting rings 26b and 26c are formed at the same time as body region 26, and N+ field limiting rings 28b and 28c are formed at the same time as source region 28. Field limiting rings 26b and 26c and 28b and 28c are aligned by using the edges 17a&b. and 17c&d of field plates 16h and 16 to define the lateral edges of the field limiting rings as shown in FIG. 16a. FIG. 16a illustrates a transistor at the process step illustrated by FIG. 7.

A variation on the transistor of FIG. 16 is shown in FIG. 17, where the transistor is surrounded by an EQR including P+ region 24b and EQR metallization 30a, similar to the EQR structure shown in FIG. 11. Again, P+ region 24b is formed at the same time as deep body region 24.

As shown in FIG. 18, an additional embodiment of the invention is a transistor similar to that shown in FIG. 14, having field limiting rings comprising P regions 26c and 26d, with additional field limiting ring N+ regions 28c and 28d formed inside P regions 26c and 26d, respectively. Regions 26c and 26d are formed at the same time as body region 26, and regions 28c and 28d are formed at the same time as source region 28, using the edges of rings 16h and 16i to define the lateral extent of the field rings as described previously in reference to FIG. 16a. In this embodiment, field plate 16g is electrically connected to adjacent region 24a, field plate 16h is electrically connected to adjacent N+ region 28c, and field plate 16i is electrically connected to region 28d by metallization layers 30b, 30c and 30d.

FIG. 19 depicts a variant of the transistor shown in FIG. 18. The variation, as described above, is an EQR including P+ region 24b surrounding the transistor, with EQR metallization layer 30a in contacting region 24b and the substrate.

While the invention has been described with reference to specific details, those skilled in the art will recognize that changes can be made in form and detail without departing from the spirit and scope of the invention. For example, both N and P channel transistors can be formed using this process. In addition, the transistor can be formed either in a substrate or in an epitaxial layer formed on a substrate. Accordingly, all such modifications come within the present invention.

We claim:

1. A transistor comprising:
    a first semiconductor region of a first conductivity type, said first semiconductor region having a principal surface;
    an insulation layer on said principal surface;
    a conductive gate on said insulating layer;
    at least one conductive ring overlying said principal surface and laterally surrounding said conductive gate, said conductive ring serving as a field plate;
    a second semiconductor region of a second conductivity type lying within said first semiconductor region, said second semiconductor region serving as the transistor body region;
    a third semiconductor region of said second conductivity type within said first semiconductor region, said third semiconductor region laterally surrounding said conductive ring, an edge of said conductive ring defining an edge of said third semiconductor region;
    a fourth semiconductor region of said first conductivity type lying within said second semiconductor region, said fourth semiconductor region serving as the transistor source region;
    and a conductive layer overlying said third semiconductor region, said conductive layer being electrically connected to said first and third semiconductor regions, said conductive layer serving as an equipotential ring.

2. The transistor of claim 1 further comprising a fifth semiconductor region of said second conductivity type laterally surrounding and in contact with said fourth semiconductor region and serving as a deep body perimeter region and being formed at the same time as said third semiconductor region.

3. The transistor of claim 2 further comprising:
    at least one sixth semiconductor region of said second conductivity type, said sixth semiconductor region serving as a field limiting ring and lying within said first semiconductor region and surrounding said conductive gate.

4. The transistor of claim 3, wherein each of said conductive rings is electrically connected to one of said sixth semiconductor regions.

5. The transistor of claim 2, further comprising:
    at least one sixth semiconductor region of said second conductive type within said first semiconductor region, said sixth semiconductor region serving as a field limiting ring and surrounding said conductive gate and being formed during said step of forming said second semiconductor region;
    and a seventh semiconductor region of said first conductivity type within each of said sixth semiconductor regions, said seventh semiconductor region serving as a field limiting ring and being formed during said step of forming said fourth semiconductor region.

6. The transistor of claim 5 wherein each of said conductive rings is electrically connected to one of said seventh semiconductor regions.

7. The transistor of claim 1, further comprising:
    said third semiconductor region and said second semiconductor region being formed at the same time;
    a fifth semiconductor region of said first conductivity type within said third semiconductor region, an edge of said conductive ring defining an edge of said fifth semiconductor region, said fifth semiconductor region being formed during said step of forming said fourth semiconductor region; and
    a conductive layer overlying said third and said fifth semiconductor regions, said conductive layer being electrically connected to said first, third, and fifth semiconductor regions, said conductive layer serving as an equipotential ring.

8. The transistor of claim 7 further comprising a sixth semiconductor region of said second conductivity type laterally surrounding said second and fourth semiconductor region, said sixth semiconductor region serving as a deep body device perimeter region.

9. The transistor of claim 8 further comprising at least one seventh semiconductor region of said second conductivity type within said first semiconductor region, said seventh semiconductor region serving as a field limiting ring and surrounding said conductive gate and being formed at the same time as said sixth semiconductor region.

10. The transistor of claim 9, wherein each of said conductive rings is electrically connected to one of said seventh semiconductor regions.

11. The transistor of claim 8, further comprising:
    at least one seventh semiconductor region of said second conductivity type within said first semiconductor region, said seventh semiconductor region serving as a field limiting ring and surrounding said conductive gate and being formed at the same time as said second semiconductor region;
    and an eighth semiconductor region of said first conductivity type within each of said seventh semiconductor regions; said eighth semiconductor region serving as a field limiting ring and being formed at the same time as said fourth semiconductor region.

12. The transistor of claim 11 wherein each of said conductive rings is electrically connected to one of said eighth semiconductor regions.

13. A transistor formed within a first semiconductor region of a first conductivity type, said transistor being laterally surrounded by an EQR comprising:
    a second semiconductor region of a second conductivity type formed in said first semiconductor region;
    a third semiconductor region of said first conductivity type formed wthin said second semiconductor region; and
    a first conductive layer formed on and electrically contacting said third semiconductor region, said first conductive layer also electrically contacting said second and first semiconductor regions.

14. The transistor of claim 13 wherein said first conductive layer is metal.

15. The transistor of claim 13 further comprising a field limiting ring laterally surrounding said transistor, said first conductive layer laterally surrounding said field limiting ring, the edge of said field limiting ring defining an edge of said second and third semiconductor regions.

* * * * *

UNITED STATES PATENT AND TRADEMARK OFFICE
CERTIFICATE OF CORRECTION

PATENT NO. : 4,816,882

DATED : March 28, 1989

INVENTOR(S) : Richard A. Blanchard, Adrian Cogan

It is certified that error appears in the above-identified patent and that said Letters Patent is hereby corrected as shown below:

On the title page,
References Cited

Please add the following references:

--1. U.K. Patent Application No. 2,082,385, International Rectifier Corporation, filed 12 August 1981.

2. U.S. Patent No. 4,466,176, V.A.K. Temple, 21 August 1984.

3. PCT Application No. WO 82/02981, Motorola, Inc., filed 2 September 1982.

4. European Patent Application No. 0 118 921, Nissan Motor Co., LTD., filed 13 March 1984.--

Col. 8, line 7, "16iare" should be --16i are--

Col. 8, line 37, "16h and 16to" should be --16h and 16i to--

Signed and Sealed this

Twenty-third Day of January, 1990

Attest:

JEFFREY M. SAMUELS

Attesting Officer     Acting Commissioner of Patents and Trademarks